United States Patent
Lizotte

(10) Patent No.: US 6,787,693 B2
(45) Date of Patent: Sep. 7, 2004

(54) FAST TURN ON/OFF PHOTOVOLTAIC GENERATOR FOR PHOTOVOLTAIC RELAY

(75) Inventor: Steven C. Lizotte, Long Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/309,363

(22) Filed: Dec. 3, 2002

(65) Prior Publication Data

US 2003/0106580 A1 Jun. 12, 2003

Related U.S. Application Data

(60) Provisional application No. 60/337,423, filed on Dec. 6, 2001.

(51) Int. Cl.[7] .......................... H01L 31/04; H01L 31/068
(52) U.S. Cl. ...................... 136/261; 136/249; 136/255; 136/256; 257/466; 257/464; 257/461; 257/446; 257/443
(58) Field of Search ................................ 136/249, 255, 136/261, 256; 257/466, 464, 461, 446, 443

(56) References Cited

U.S. PATENT DOCUMENTS

| | | | | |
|---|---|---|---|---|
| 4,721,986 A | * | 1/1988 | Kinzer | 257/336 |
| 4,795,500 A | * | 1/1989 | Kishi et al. | 136/244 |
| 5,254,179 A | * | 10/1993 | Ricaud et al. | 136/244 |
| 5,334,259 A | * | 8/1994 | Mizumura et al. | 136/258 |
| 5,549,762 A | * | 8/1996 | Cantarini | 136/249 |
| 5,716,459 A | * | 2/1998 | Chang et al. | 136/249 |
| 5,973,257 A | * | 10/1999 | Cantarini et al. | 136/249 |
| 6,054,365 A | * | 4/2000 | Lizotte | 438/430 |
| 6,229,194 B1 | * | 5/2001 | Lizotte | 257/506 |
| 6,281,428 B1 | * | 8/2001 | Chiu et al. | 136/255 |
| 6,472,254 B2 | * | 10/2002 | Cantarini et al. | 438/138 |

OTHER PUBLICATIONS

Cantarini et al, "Micro–Machined Dielectrically Isolated (MMDI) Wafer Technology," Proceedings 1998 IEEE International SOI Conference, Oct. 1998, pp. 173–174.*

* cited by examiner

*Primary Examiner*—Alan Diamond
(74) *Attorney, Agent, or Firm*—Ostrolenk, Faber, Gerb & Soffen, LLP

(57) ABSTRACT

A photovoltaic generator constructed on an SOI N⁻ layer subdivided into a series of connected isolated tubs whereby the isolated tubs are subdivided by a matrix of trenched wells. A P⁺ junction is formed into the top surface of each well to define a photovoltaic generator junction for its respective well.

16 Claims, 1 Drawing Sheet

FAST TURN ON/OFF PHOTOVOLTAIC GENERATOR FOR PHOTOVOLTAIC RELAY

RELATED APPLICATIONS

This application claims the benefit of U.S. Provisional Application No. 60/337,423, filed Dec. 6, 2001.

FIELD OF THE INVENTION

This invention relates to semiconductor photovoltaic generators, and more specifically relates to a novel structure for a photovoltaic generator which increases its turn off speed.

BACKGROUND OF THE INVENTION

Photovoltaic generators ("PVG"s) are well known and are shown, for example, in U.S. Pat. Nos. 4,721,986 to Kinzer; 5,549,762 to Cantarini and 5,973,257 to Cantarini and Lizotte. These devices are used to provide a turn on control signal to a semiconductor device such as a power MOSFET or the like in which the input control signal is optically isolated from the MOSFET input. The total relay is known as a photovoltaic relay (PVR). Thus, in a PVR, an input radiation signal from an LED or the like illuminates the surface of a photovoltaic generator (PVG) to produce an output gate voltage to the gate of a MOSFET or other gated switching device. Photovoltaic generators ("PVG"s) are well known and are shown, for example, in U.S. Pat. Nos. 4,721,986 to Kiuzer; 5,549,762 to Cantarini and 5,973,257 to Cantarini and Lizotte. These devices are used to provide a turn on control signal to a semiconductor device such as a power MOSFET or the like in which the input control signal is optically isolated from the MOSFET input. The total relay is known as a photovoltaic relay (PVR). Thus, in a PVR, an input radiation signal from an LED or the like illuminates the surface of a photovoltaic generator (PVG) to produce an output gate voltage to the gate of a MOSFET or other gated switching device.

The frequency response of the PVR is limited, at least in part, by the turn on and turn off times of the PVG. These turn on and turn off times are coupled by design trade offs wherein a structure which reduces turn off time will also increase turn on time and vice versa. For example, increasing SOI thickness reduces turn on time, but increases turn off time. Present PVG "stacks" employ an SOI structure in which an N type silicon layer of a thickness of about 35 microns is supported by and insulated from a thicker "handle" wafer. The top surface of the SOI layer contains a shallow P type diffusion so that photons entering the silicon will generate hole-electron pairs which are collected at the P/N junction to produce an output voltage. A plurality of identical insulated structures are laterally separated from one another in a common silicon chip and are connected in series to produce the desired output voltage signal.

Such stacks, using a 35 micron thick SOI layer have a turn off time (after the input light signal is removed) of about 100 $\mu$s and a turn on time of about 30 $\mu$s. By using a thinner SOI layer, for example, 20 microns thick, turn off time is reduced to about 50 $\mu$s, but turn on time is increased to 50 $\mu$s. A further reduction in SOI thickness produces a further decrease in turn off time, but a further increase in turn on time. (The above data presumes a 12 milliampere drive to the relay input.)

It would be desirable to be able to reduce turn off time without greatly increasing turn on time.

BRIEF DESCRIPTION OF THE INVENTION

In accordance with the invention, a matrix of trenched wells extend through the thickness of the N⁻ silicon body to provide increased recombination sites to collapse the output voltage more quickly when the illumination of the device surface is removed. By using cross-sectional area trenched wells of a non-critical area and length and by spacing them relatively far apart (relative to their width dimensions), only a small amount of the area of N⁻ silicon is reduced so that turn on time is reduced by only a small amount. The trenched wells of the invention may be wells of any desired cross-sectional shape formed by etching trenches in the silicon; lining the trenches with a thin oxide (300 Å to 500 Å thick) and then filling the wells with intrinsic polysilicon.

By way of example, if a 35 micron SOI layer is used (giving faster turn on), a matrix of 3 $\mu$m×3 $\mu$m trenched wells spaced 10 $\mu$m apart (center-to-center) will reduce the N⁻ silicon area by less than 10%, thus limiting the sacrifice of turn on speed. Further, the SOI layer thickness can be increased, for example, to 50 $\mu$m so that the loss in turn on speed due to the trenched wells would be gained back in the additional 10% absorption gained from the increased SOI thickness.

The novel use of trenched wells should also be considered in combination with other factors that influence turn off time in PVGs. Thus, there are 4 items that, in combination with one another, improve the overall response time performance of the microelectronic relay. The 4 items include 1) control circuitry, 2) SOI thickness, 3) buried implant layer, and 4) the trenched wells. These items are described in more detail in the following:

1) Control Circuitry

By experimentation, it has been shown that the "BOSFET" control circuitry (U.S. Pat. No. 4,721,986: FIG. 14) is the best circuitry for "fast turn off" response time. This turn off time exceeds the response time of the control circuitry of U.S. Pat. No. 5,549,792 by about 50%, depending on the SOI thickness. The control circuitry has no impact on the turn on time but significantly improves the turn off time.

2) SOI Thickness

A thinner SOI thickness reduces the turn off time, but in exchange, increases turn on time due to a higher short circuit current produced from the thicker SOI layer. The best combination of turn on to turn off time has been found to be the thinner SOI thickness of 20 $\mu$m (best range 15–25 $\mu$m). A reduction of about 30 to 35% faster turn off is gained by using the thinner SOI while only reducing the turn on time by about 15 to 20%.

3) Buried Implant Layer

When comparing the buried N⁺ layer (at the bottom of the silicon layer), the turn off time had about 30% improvement, with no impact on turn on time.

4) Trenched Wells

A 40–50% reduction in turn off time is achieved over the standard cell (no trenched wells) by adding the trenched wells while only reducing the turn on time by 15–20%. The best percent reduction in silicon (due to the trenched wells) to achieve the best combination of turn on versus turn off time is in the region of 10% to 20% reduction of the cell area.

In Summary

By combining all 4 options, the response time can be significantly improved. This improvement can be seen in the following table as a 4 times improvement in the frequency response over prior art devices.

| | Ton | Toff | Freq Response |
|---|---|---|---|
| Fastest relay (PVA 3054N) | | | |
| Current Design | 18 μs | 26 μs | 1100 Hz |
| New Design | 25 μs | 20 μs | 5000 Hz |
| Larger Relays (PVA 3354N) | | | |
| Current Design | 55 μs | 35 μs | 500 Hz |
| New Design | 60 μs | 25 μs | 2000 Hz |

BRIEF DESCRIPTION OF THE INVENTION

Figure 1:
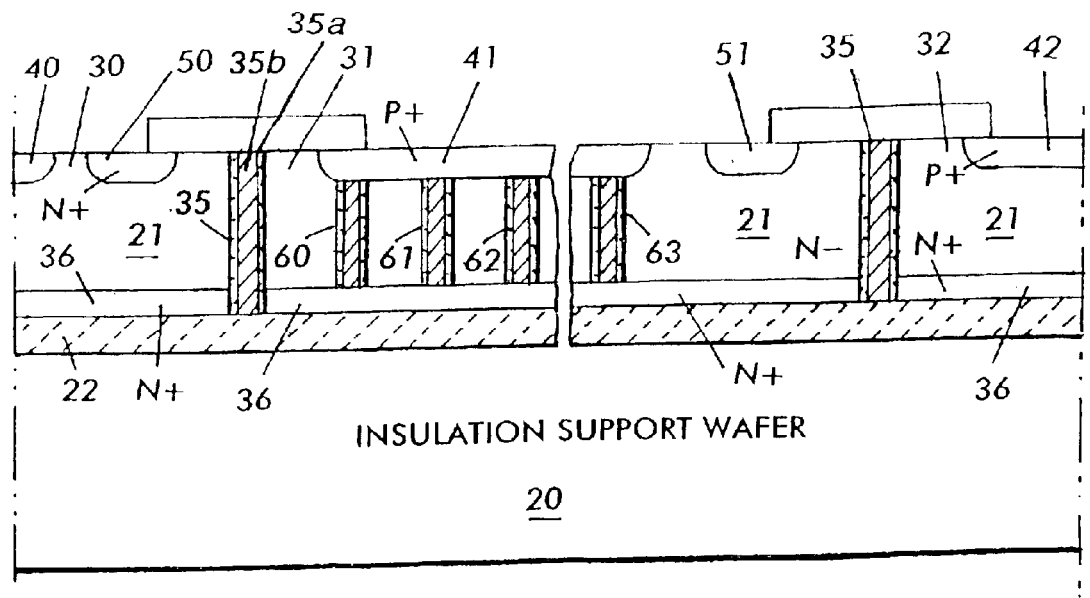
FIG. 1 is a cross-section of small part of a PVG containing the pillars of the present invention.
Figure 2:
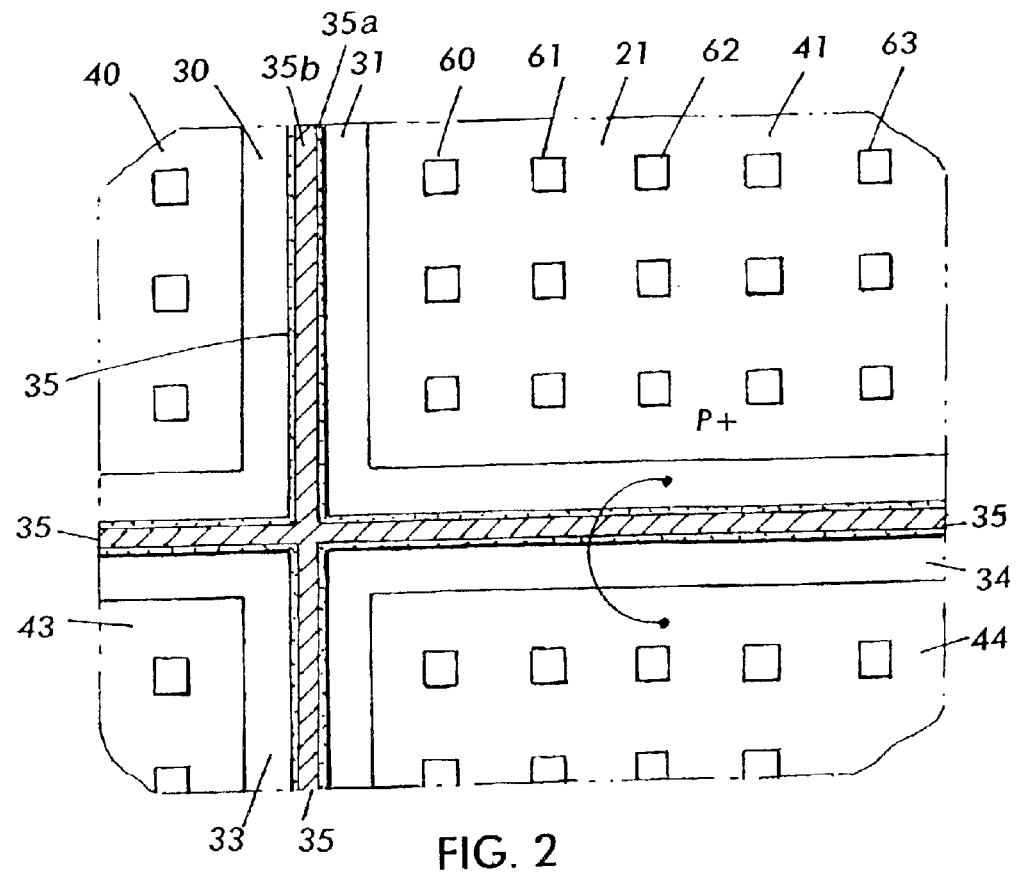
FIG. 2 is a top view of the PVG of FIG. 1.

Referring to FIGS. 1 and 2, there is shown a PVG of the type shown in U.S. Pat. No. 5,549,762, in which a support or handle wafer 20 (FIG. 1) has a thin SOI silicon Layer 21 bonded thereto by oxide insulation layer 22. A plurality of wells 30, 31, 32, 33, 34 are defined by a non-conductive polysilicon filler web 35. Web 35 can be formed by a thin oxide layer 35a in an etched trench, and an intrinsic polysilicon fill 35b. Each well 30 to 34 has a bottom $N^+$ layer 36. Each well 30 to 34 has a shallow $P^+$ diffusion 40 to 44 respectively, and an $N^+$ contact diffusion (50 and 51 in FIG. 1) to enable the series connection of the cells as shown in FIG. 1.

In accordance with the invention a plurality of trenched wells, schematically shown as 60 to 63 in FIG. 1 are formed vertically through the SOI 21 and similar trenched wells are arranged over the full surface of the SOI 21 (FIG. 2). Each well may be formed like web 35 of a trench lined with oxide about 300 Å to 500 Å thick and filled with intrisic polysilicon.

The SOI 21 is preferably about 20 μm thick and should be in the range of 15 to 25 μm. The trenched wells 60 to 63 preferably have a size of about 3 μm×3 μm and spaced by about 10 μm center-to-center. The center-to-center spacing may range from about 7 to 13 μm and the size of the trenched wells may also be selected as desired. The wells may have any desired depth and need not extend to the $N^+$ layer 36. Further, the trench wells can be formed from the bottom of the device and not extend fully to the top of the silicon.

While FIG. 2 shows the pedestals as a rectangular array, other geometries can be used. For example, the trenched wells can be staggered and can also be formed as trench type elongated wells to obtain the proper percentage of trenched well to silicon area.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A photovoltaic generator comprising an insulation support wafer; a layer of monocrystalline silicon of one conductivity type disposed atop and insulated from said support wafer; a dielectric barrier web extending through said layer of silicon and dividing said layer of silicon into a plurality of laterally separated wells; each of said wells containing a shallow diffusion of a second conductivity type, thereby to define a junction to produce an output voltage in response to the illumination of the surface of said photovoltaic generator; and a plurality of spaced trenched wells extending from the top surface through at least a portion of the full thickness of said layer of silicon.

2. The device of claim 1 wherein said layer of silicon has a thickness greater than about 10 μm.

3. The device of claim 1 wherein said trenched wells are spaced from one another by about 5 microns to about 20 microns, center to center.

4. The device of claim 1 wherein each of said trenched wells has a rectangular crossection.

5. The device of claim 1 wherein said laterally separated wells are electrically connected in series.

6. The device of claim 1 wherein the bottoms of each of said cells laterally separated wells in said silicon layer are lined with a highly doped thin layer of said one conductivity type.

7. The device of claim 1 wherein said silicon layer is an epitaxially formed layer.

8. The device of claim 1 wherein said dielectric web is polysilicon.

9. The device of claim 2 wherein said trenched wells are spaced from one another by about 5 microns to about 20 microns, center to center.

10. The device of claim 9 wherein said trenched wells are spaced from one another by about 5 microns to about 20 microns, center to center.

11. The device of claim 10 wherein each of said trenched wells has a maximum thickness in any direction of about 3 microns.

12. The device of claim 11 wherein said silicon layer is an epitaxially formed layer.

13. The device of claim 12 wherein said dielectric barrier web is polysilicon.

14. The device of claim 13 wherein said laterally separated wells are electrically connected in series.

15. The device of claim 14 wherein the bottoms of each of said laterally separated wells in said silicon layer are lined with a highly doped thin layer of said conductivity type.

16. A photovoltaic generator comprising an insulation support wafer; a layer of monocrystalline silicon of one conductivity type disposed atop and insulated from said support wafer; a dielectric barrier web extending through said layer of silicon and dividing said layer of silicon into a plurality of laterally separated wells; each of said wells containing a shallow diffusion of a second conductivity type, thereby to define a junction to produce an output voltage in response to the illumination of the surface of said photovoltaic generator; and a plurality of spaced trenched wells formed from the bottom surface of the SOI silicon layer that do not extend through the entire silicon layer.

* * * * *